(12) United States Patent
Higashitani et al.

(10) Patent No.: US 6,492,229 B2
(45) Date of Patent: Dec. 10, 2002

(54) SEMICONDUCTOR DEVICE HAVING REDUCED FIELD OXIDE RECESS AND METHOD OF FABRICATION

(75) Inventors: Masaaki Higashitani, Tokohama (JP); Toru Ishigaki, Yokohama (JP); Hao Fang, Cupertino, CA (US)

(73) Assignees: Advanced Micro Devices, Inc., Sunnyvale, CA (US); Fujitsu Limited (JP); Fujitsu AMD Semiconductor Ltd. (JP)

( * ) Notice: Subject to any disclaimer, the term of this patent is extended or adjusted under 35 U.S.C. 154(b) by 0 days.

(21) Appl. No.: 09/729,516

(22) Filed: Dec. 4, 2000

(65) Prior Publication Data

US 2001/0051410 A1 Dec. 13, 2001

Related U.S. Application Data

(60) Provisional application No. 60/169,187, filed on Dec. 6, 1999.

(51) Int. Cl.[7] .......................................... H01L 21/8247
(52) U.S. Cl. ......................... 438/258; 438/264; 438/443
(58) Field of Search ................................. 438/258, 264, 438/439, 443, 444

(56) References Cited

U.S. PATENT DOCUMENTS

| | | | | |
|---|---|---|---|---|
| 5,661,072 A | * | 8/1997 | Jeng ............................ 438/439 |
| 5,821,153 A | * | 10/1998 | Tsai et al. .................... 438/439 |
| 6,054,366 A | * | 4/2000 | Yamagishi et al. ......... 438/443 |

* cited by examiner

*Primary Examiner*—Chandra Chaudhari
(74) *Attorney, Agent, or Firm*—Sawyer Law Group LLP

(57) ABSTRACT

A semiconductor device having reduced field oxide recess and method of fabrication is disclosed. The method of fabricating the semiconductor device begins by performing an HF dip process on a substrate after field oxidation followed by performing a select gate oxidation. Thereafter, a core implant and a field implant are performed. After the implants, a tunnel oxide mask is deposited. The select gate oxide is then etched in areas uncovered by the tunnel oxide mask, and tunnel oxidation is performed.

3 Claims, 3 Drawing Sheets

SEMICONDUCTOR DEVICE HAVING REDUCED FIELD OXIDE RECESS AND METHOD OF FABRICATION

CROSS-REFERENCE TO RELATED APPLICATION

This application is claiming under 35 USC 120 the benefit of provisional patent application serial No. 60/169,187 filed on Dec. 6, 1999.

FIELD OF THE INVENTION

The present invention relates to memory arrays, and more particularly to a semiconductor device having reduced field oxide recess and method of fabrication.

BACKGROUND OF THE INVENTION

Achieving higher densities on a memory chip and using less processing steps is a common goal during chip fabrication. The various processes and techniques used to manufacture chips have therefore become increasingly important. Part of the process involved in manufacturing a flash memory array, for example, requires generating select gate transistors and word-line transistors on a silicon substrate with different gate oxide thickness, as shown in FIGS. 1A and 1B.

FIG. 1A is a top view of a portion of a flash memory array 10 showing a select gate region 12 of the chip where select gates 14 are located and a word-line region 16 where word-line gates 18 are located. FIG. 1B is a cross-sectional view of the memory array 10. Both the select gate 14 and word-line gate 18 are grown over a gate oxide layer, but the gate oxide 20 in the select gate region 12 is thicker than the gate oxide 22 in the word-line region 16.

The first step for fabricating the array 10 is creating columns of active regions and insulating field oxide regions (FOX) using a LOCOS (LOCal Oxidation of Silicon) process. After LOCOS, the next major step is the oxidation process, which typically includes performing a select gate oxidation process for the select gate region 12 and performing a tunnel gate oxidation process for the word line region 16.

FIG. 2 is a flow chart illustrating a conventional oxidation process. To obtain a high quality gate oxide, the first step of the process is to perform a "sacrificial" oxidation in step 30 whereby a sacrificial layer of oxide is grown on exposed active regions to remove any unwanted material from the substrate to obtain sufficient integrity of the tunnel gate oxide 22 and the select gate oxide 20. Integrity of the tunnel gate oxide 22 is required because during program and erase of flash memories, approximately 20 v is applied to the word line region 16. This is in contrast to the select gate region 12 in which only approximately 5 v is applied.

Thereafter, a core implant process and field implant process are performed in steps 32 and 34. After the implants, an HF dip is performed for approximately 10 minutes to remove approximately 300 Angstroms of material in step 36. The reason for the sacrificial oxidization in step 30 is to prevent a recess in the field oxide caused by the HF dip, as shown in FIG. 3.

FIG. 3 is a cross-sectional view of the substrate 10 showing that if the sacrificial oxidization process were not performed, the HF dip process would create a field oxide recess 46 between the edges of the FOX regions 48 and the substrate 10.

Referring again to FIG. 2, after the HF dip, select gate oxidation is performed in step 38 in which a layer of select gate oxide is grown over both regions of the substrate to a depth of approximately 150 angstroms, followed by a deposition of a tunnel oxide mask in step 40.

Thereafter, a wet-etch process is performed to remove the select gate oxide 20 in the word-line region 16 that is not covered by the tunnel oxide mask in step 42. After the gate oxide 20 is removed from the word-line region 16, the tunnel oxide mask is removed. This is followed by tunnel oxidation where a layer of gate oxide is grown over both regions in step 44.

Referring again to FIG. 1B, this process will result in a select gate oxide 20 having a thickness of approximately 180 angstroms, and a tunnel oxide 22 having a thickness of approximately 90 angstroms. Although the conventional oxidation process effectively provides the select gate oxide 20 and tunnel gate oxide 22, it requires extra steps to prevent the field oxide recess 46.

Accordingly, a more efficient oxidation process for providing the select gate oxide 20 and tunnel gate oxide 22 that reduces field oxide recess is needed. The present invention addresses such a need.

SUMMARY OF THE INVENTION

The present invention provides a semiconductor device having reduced field oxide recess and method of fabrication. The method for fabricating the semiconductor device begins by performing an HF dip process on a substrate after field oxidation, followed by performing a select gate oxidation. Thereafter, a core implant and a field implant are performed. After the implants, a tunnel oxide mask is deposited. The select gate oxide is then etched in areas uncovered by the tunnel oxide mask, and tunnel oxidation is performed.

According to the system and method disclosed herein, a sacrificial oxidation step is skipped in the select gate region and replaced by the select gate oxidation. This reduces the number of process steps necessary for select gate formation, while reducing the field oxide recess, and maintaining sufficient integrity of the tunnel gate oxide.

DETAILED DESCRIPTION OF THE INVENTION

Figure 1A:
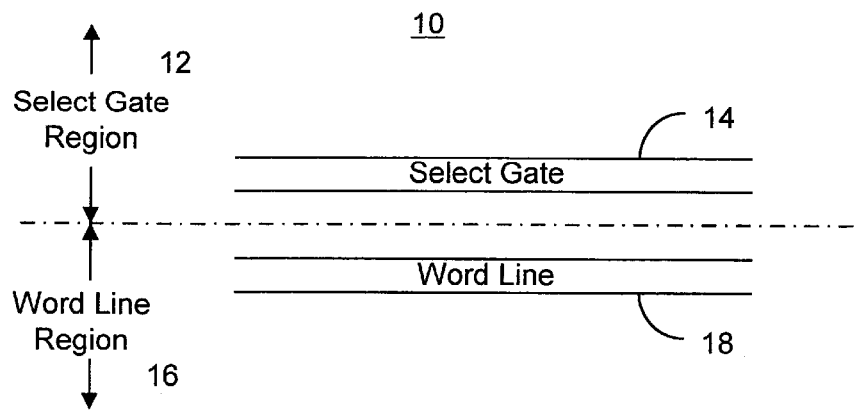
FIG. 1A is a top view of a portion of a flash memory array.
Figure 1B:
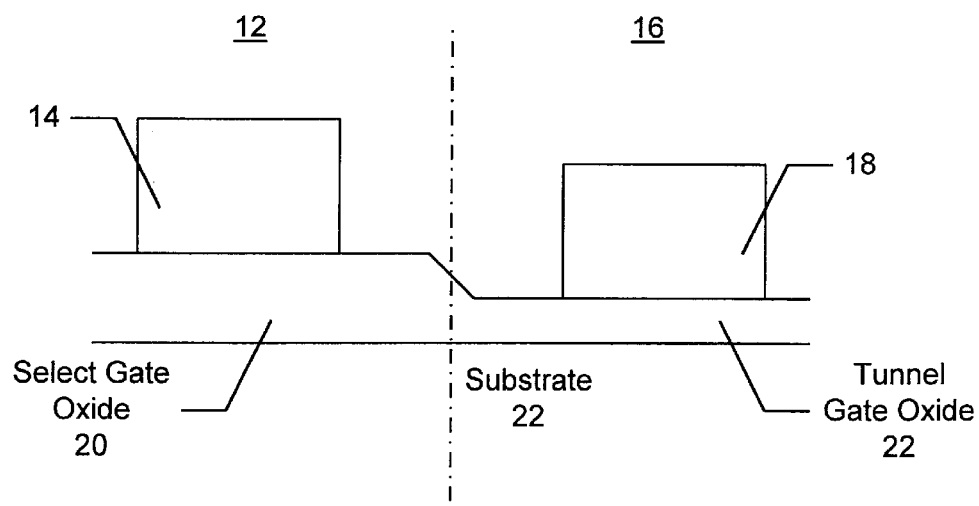
FIG. 1B is a cross-sectional view of the memory array.
Figure 2:
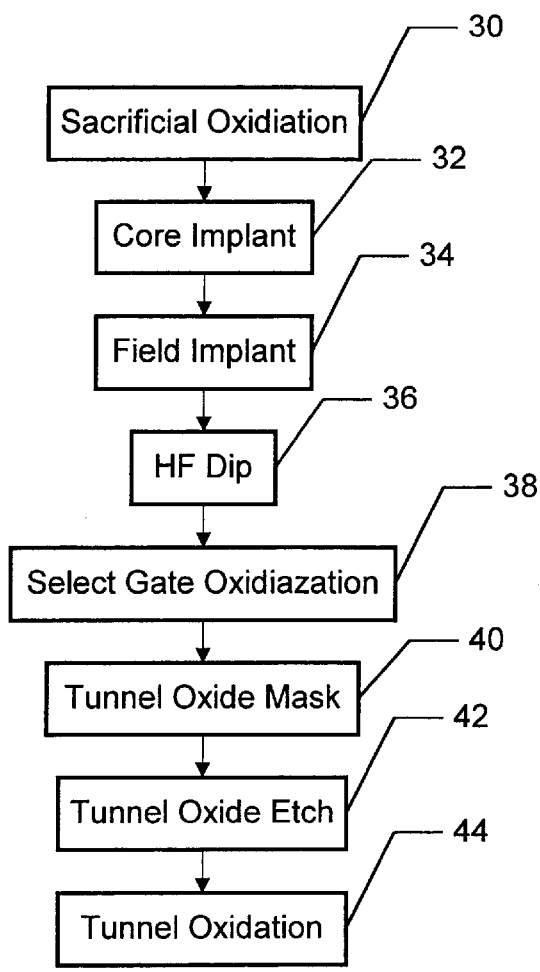
FIG. 2 is a flow chart illustrating a conventional oxidation process.
Figure 3:
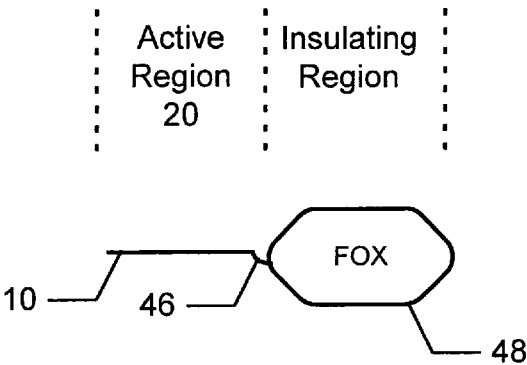
FIG. 3 is a cross-sectional view of a substrate showing a field oxide recess between the edges of the FOX regions and the substrate.

The present invention relates to an improvement in the fabrication of memory arrays. The following description is presented to enable one of ordinary skill in the art to make and use the invention and is provided in the context of a patent application and its requirements. Various modifications to the preferred embodiment will be readily apparent to those skilled in the art and the generic principles herein may be grown to other embodiments. Thus, the present invention is not intended to be limited to the embodiment shown but is to be accorded the widest scope consistent with the principles and features described herein.

The present invention is a semiconductor device having reduced field oxide recess and method of fabrication, while reducing the number of processing steps required for the oxidation process in the select gate region 12 of a memory array 10. The present invention will be described in terms of a fabricating a flash memory array 10 using gate oxide. However, one of ordinary skill in the art will readily recognize that this method and system will operate effectively for an oxidation process used to fabricate other types of integrated circuits.

Applicant's have realized that performing the sacrificial oxidation in both the select gate region 12 and the word line region 16 is inefficient because the select gate oxide 20 is thicker than the tunnel gate oxide 22, and therefore no sacrificial oxidation is needed in the select gate region 12. According the present invention, the select gate oxidation is used instead to perform the function of the sacrificial oxidation. More specifically, an HF dip and select gate oxidation process are performed, which are then followed by core and field implant steps. The oxidation process of the present invention reduces field oxide recess and also reduces the number of steps required for oxidation of the select gate region 12.

Figure 4:
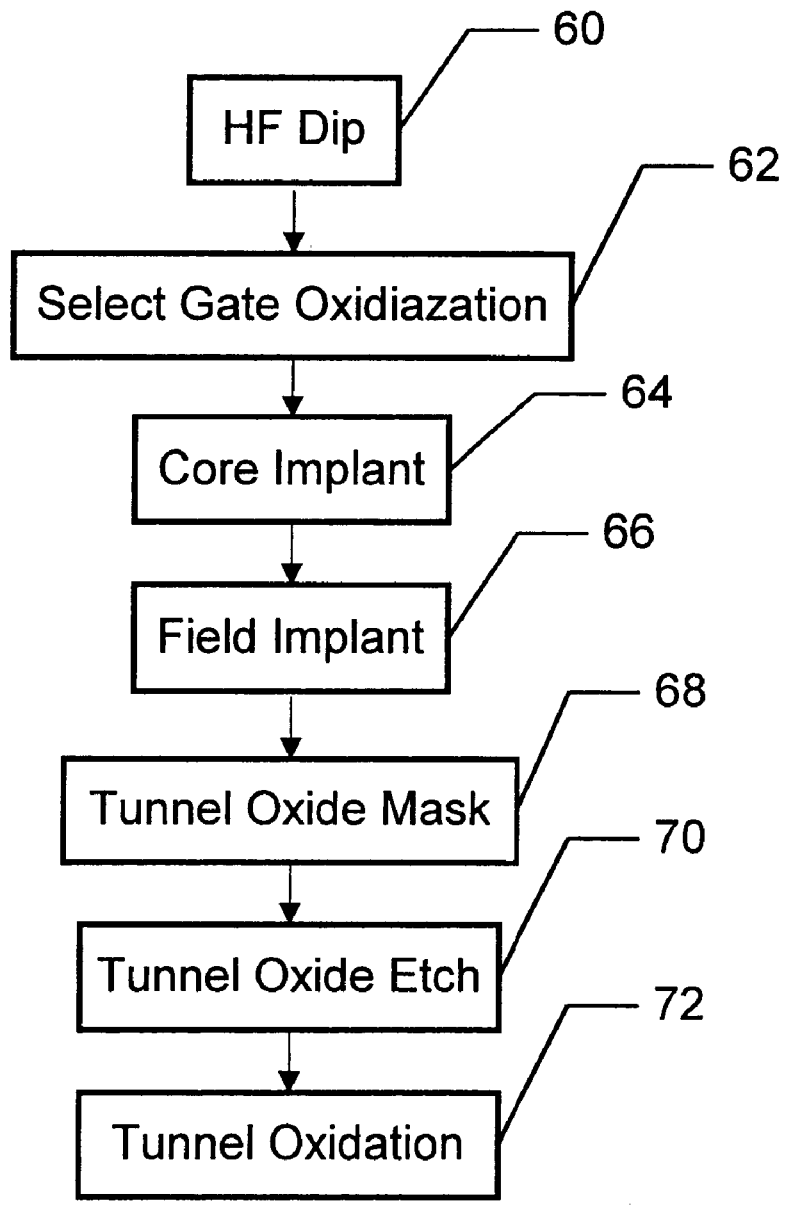
FIG. 4 is a flow chart illustrating a select gate region oxidation process in accordance with the present invention.

To more particularly describe the present invention, refer now to FIG. 4 depicting a flow chart illustrating an oxidation process for the select gate region in accordance with the present invention.

Instead of performing a "sacrificial" oxidation, the first step of the process is to perform an HF dip in step 60. After the HF dip, select gate oxidation is performed in which a layer of select gate oxide 20 is grown in both regions 12 and 16 of the substrate to a depth of approximately 150 angstroms in step 62. According to the present invention, the select gate oxide 20 is used as the sacrificial oxide so the HF dip can be performed for a shorter time period so that only a small amount of material is removed (e.g., 3 minutes to remove approximately 70 angstroms). Because less material is removed during the HF dip, field oxide recess is reduced.

After select gate oxidation, a core implant process and field implant process are performed in steps 64 and 66, followed by a deposition of a tunnel oxide mask in step 68.

Thereafter, a wet-etch process is performed to remove the select gate oxide 20 in the word-line region 16 that is not covered by the tunnel oxide mask in step 70. After the gate oxide 20 is removed from the word-line region 16, the tunnel oxide mask 24 is removed. This is followed by tunnel oxidation where a layer of gate oxide is grown over both regions in step 72.

According to the present invention, the oxidation process for the select gate region 12 is performed in less steps than required for the conventional oxidation process and also results in reduced field oxide recess, while maintaining the integrity of the tunnel gate oxide 22. Although integrity of the select gate oxide may be reduced, this result is acceptable from a Flash Memory point of view.

A semiconductor device having reduced field oxide recess and method of fabrication has been disclosed. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for fabricating a semiconductor device having reduced field oxide recess, comprising the steps of:
   (a) performing an HF dip process on a substrate after field oxidation and without performing a sacrificial oxidation;
   (b) performing a select gate oxidation;
   (c) performing an implant subsequent to the HF dip and the select gate oxidation;
   (d) depositing a tunnel oxide mask;
   (e) performing an etch to remove the select gate oxide uncovered by the mask; and performing a tunnel oxidation.

2. The method of claim 1, further including the step of performing steps (a)–(f) in a select gate region of a flash memory array.

3. The method of claim 2 wherein step (a) further includes the step of:
   (i) performing the HF dip for a time necessary to remove approximately 70 angstroms of material.

* * * * *